United States Patent
Gong et al.

(10) Patent No.: US 9,799,571 B2
(45) Date of Patent: Oct. 24, 2017

(54) METHODS FOR PRODUCING INTEGRATED CIRCUITS WITH INTERPOSERS AND INTEGRATED CIRCUITS PRODUCED FROM SUCH METHODS

(71) Applicant: GLOBALFOUNDRIES Singapore Pte. Ltd., Singapore (SG)

(72) Inventors: Shunqiang Gong, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/799,748

(22) Filed: Jul. 15, 2015

(65) Prior Publication Data

US 2017/0018468 A1    Jan. 19, 2017

(51) Int. Cl.
*H01L 21/66* (2006.01)
*H01L 21/48* (2006.01)
*H01L 23/498* (2006.01)

(52) U.S. Cl.
CPC ............ *H01L 22/14* (2013.01); *H01L 21/481* (2013.01); *H01L 22/32* (2013.01); *H01L 22/34* (2013.01); *H01L 23/498* (2013.01); *H01L 2224/16225* (2013.01); *H01L 2924/15311* (2013.01)

(58) Field of Classification Search
CPC .................................................. H01L 22/14
See application file for complete search history.

(56) References Cited

U.S. PATENT DOCUMENTS

| | | | | |
|---|---|---|---|---|
| 5,086,558 A | * | 2/1992 | Grube | H01L 21/563 257/E21.503 |
| 7,501,839 B2 | * | 3/2009 | Chan | G01R 1/06711 324/754.18 |
| 8,405,229 B2 | * | 3/2013 | Antesberger | H01L 23/49833 257/690 |
| 8,716,873 B2 | * | 5/2014 | Wang | H01L 21/4832 257/690 |
| 8,772,921 B2 | * | 7/2014 | Toh | H01L 23/3171 257/686 |
| 8,933,345 B1 | * | 1/2015 | Rahman | H01L 23/147 174/262 |
| 2006/0043477 A1 | * | 3/2006 | Akram | G01R 1/07314 257/337 |
| 2008/0020566 A1 | * | 1/2008 | Egitto | G01R 1/06711 438/637 |
| 2008/0153187 A1 | * | 6/2008 | Luo | G01R 31/2886 438/17 |
| 2008/0308800 A1 | * | 12/2008 | Otsuki | H01L 22/14 257/48 |
| 2013/0341783 A1 | * | 12/2013 | Alfano | H01L 23/544 257/734 |

(Continued)

*Primary Examiner* — Matthew Landau
*Assistant Examiner* — Grant Withers
(74) *Attorney, Agent, or Firm* — Lorenz & Kopf, LLP

(57) ABSTRACT

Methods of producing integrated circuits with interposers and integrated circuits produced from such methods are provided. In an exemplary embodiment, a method of producing an integrated circuit includes producing an interposer with an insulation plate and a plurality of through vias passing through the insulation plate. The interposer has a prime area and an in prime area. A prime area test circuit is formed in the prime area, where the prime area test circuit includes a portion of the plurality of through vias that are electrically connected in series.

16 Claims, 8 Drawing Sheets

(56) References Cited

U.S. PATENT DOCUMENTS

| | | | | |
|---|---|---|---|---|
| 2014/0264914 A1* | 9/2014 | Meyer | ............... | H01L 23/31 |
| | | | | 257/774 |
| 2014/0287541 A1* | 9/2014 | Yasumura | ............ | H01L 23/544 |
| | | | | 438/15 |
| 2015/0084051 A1* | 3/2015 | Kubo | ............... | H01L 22/32 |
| | | | | 257/48 |
| 2015/0235993 A1* | 8/2015 | Cheng | ............... | H01L 25/50 |
| | | | | 257/712 |
| 2015/0311188 A1* | 10/2015 | Mao | ............... | H01L 25/50 |
| | | | | 438/15 |
| 2016/0111387 A1* | 4/2016 | Dang | ............... | H01L 24/17 |
| | | | | 257/737 |
| 2016/0225679 A1* | 8/2016 | Kannan | ............... | H01L 22/14 |

* cited by examiner

METHODS FOR PRODUCING INTEGRATED CIRCUITS WITH INTERPOSERS AND INTEGRATED CIRCUITS PRODUCED FROM SUCH METHODS

TECHNICAL FIELD

The technical field generally relates to methods for producing integrated circuits with interposers and integrated circuits produced from such methods, and more particularly relates to methods for producing integrated circuits with interposers including test circuits that can be electrically interrogated during production and integrated circuits produced from such methods.

BACKGROUND

The semiconductor industry is continuously moving toward the fabrication of smaller and more complex integrated circuits with higher performance. Most of the reductions in size of electronic components have come from reductions in feature size, so more components can be utilized in a given area to provide a higher density. The smaller feature size has generally reduced integrated circuit size in a two dimensional manner, because more components can be incorporated onto the surface of an integrated circuit chip of a given size. This increase in component density has decreased the area of the integrated circuit and has surpassed the ability to bond some integrated circuit chips directly to a substrate.

Interposers are utilized to redistribute contact points from an integrated circuit chip to a larger area on the interposer. Interposers also allow for three dimensional packaging of multiple integrated circuit chips. The interposers generally include solder points, electrically conductive through vias, and insulating components that redistribute the contact areas from the integrated circuit chip to the larger interposer. However, the aforementioned features of the interposers can introduce large coefficient of thermal expansion (CTE) mismatches that induce stress, and the induced stress can produce defects. Quality assurance electrical interrogations are typically performed at a test circuit of the interposer after the packaged interposer and integrated circuit chip(s) are finished. Sample interposers are typically electrically interrogated for quality assurance on a periodic basis, such as monthly, biweekly, or weekly. If a fault is found during quality assurance testing, any interposers produced between a passing quality assurance test and a failed quality assurance test may likewise be defective. Furthermore, the quality assurance electrical test circuit is typically outside of a prime portion of the interposer where electrical connections are formed between an integrated circuit chip and other components of the integrated circuit. Quality assurance testing in frame areas that do not form electrical connections for the integrated circuit may not provide results that accurately monitor the product quality.

Accordingly, it is desirable to provide methods of producing integrated circuits with interposers having quality assurance test circuits that can be electrically interrogated during the manufacturing process, and integrated circuits produced from such methods. In addition, it is desirable to provide methods of producing integrated circuits with interposers that enable quality control electrical interrogation within the prime area of the interposer, and integrated circuits produced from such methods. Furthermore, other desirable features and characteristics of the present embodiment will become apparent from the subsequent detailed description and the appended claims, taken in conjunction with the accompanying drawings and this background of the invention.

BRIEF SUMMARY

Methods of producing integrated circuits with interposers and integrated circuits produced from such methods are provided. In an exemplary embodiment, a method of producing an integrated circuit includes producing an interposer with an insulation plate and a plurality of through vias passing through the insulation plate. The interposer has a prime area and a frame area. A prime area test circuit is formed in the prime area, where the prime area test circuit includes a portion of the plurality of through vias that are electrically connected in series.

A method of producing an integrated circuit is provided in another embodiment. A prime area test circuit is formed in an interposer. The interposer includes an insulation plate and a plurality of through vias passing through the insulation plate, and the prime area test circuit includes a portion of the through vias. The prime area test circuit is electrically interrogated, and an integrated circuit chip is connected to the interposer after the prime area test circuit is electrically interrogated.

An integrated circuit is provided in yet another embodiment. The integrated circuit includes an interposer having a plurality of through vias passing through an insulation plate. The through vias include an electrically conductive material, and the insulation plate includes an electrically insulating material. An integrated circuit chip is electrically connected to a chip location on a top side of the interposer. A prime area test circuit is formed in the interposer, where the prime area test circuit includes a portion of the plurality of through vias. A test pad is on the top side of the interposer, where the test pad is electrically connect to the prime area test circuit, and an overmold overlies the top side of the interposer, the prime area test circuit, the test pad, and the integrated circuit chip.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits, interposers, and methods for fabricating the same. The various tasks and process steps described herein may be incorporated into a more comprehensive procedure or process having additional steps or functionality not described in detail herein. In particular, various steps in the manufacture of interposers and integrated circuits are well-known and so, in the interest of brevity, many conventional steps will only be mentioned briefly herein or will be omitted entirely without providing the well-known process details.

Figure 1:
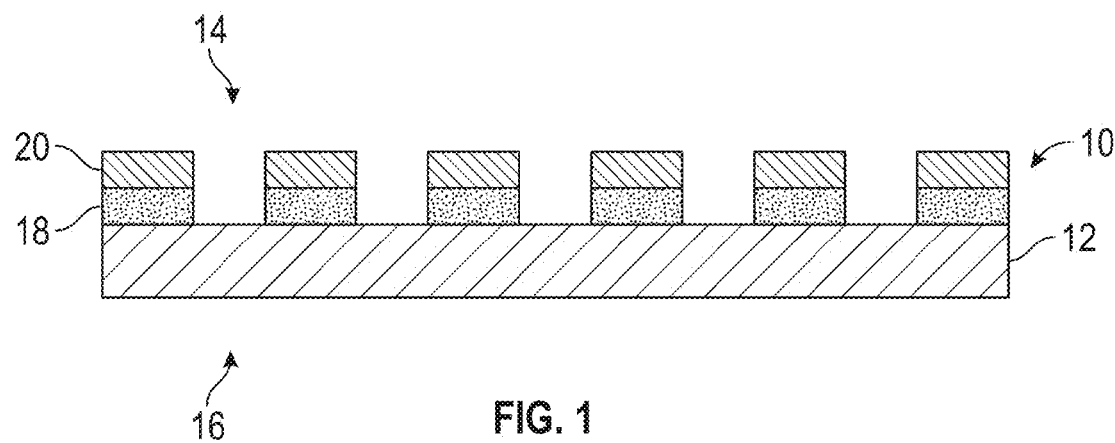
FIGS. 1 and 3-8 are cross-sectional views illustrating portions of an integrated circuit with an interposer and methods for its fabrication in accordance with an exemplary embodiment.

Basic fabrication steps for an exemplary embodiment of an interposer are illustrated in FIGS. 1-8, beginning with reference to FIG. 1. Interposers serve as a component in many integrated circuits, as described above, and several different types of interposers are available. An interposer 10 includes an insulation plate 12. In an exemplary embodiment, the insulation plate 12 comprises monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In alternate embodiments, the insulation plate 12 may primarily include polymers, such as polyimide; or glass; or other electrically insulating materials. The interposer 10 may be used as a photonics interposer, used for 3 dimensional devices, used for electrical integrated circuits, and for other uses. As used herein, an "electrically insulating material" is a material with a resistivity of about $1 \times 10^4$ ohm meters or more, and an "electrically conductive material" is a material with a resistivity of about $1 \times 10^{-4}$ ohm meters or less. The insulation plate 12 should have sufficient strength to maintain its form, and is rigid in some embodiments, but the insulation plate 12 may be somewhat flexible in alternate embodiments. The insulation plate 12 and the interposer 10 formed therefrom have a top side 14 and a bottom side 16 opposite the top side 14. The terms "top side" and "bottom side" are not intended to indicate that one side is above or over the other, because the insulation plate 12 may be flipped or turned, and those terms are merely used to distinguish the two sides of the interposer 10 for purposes of the description herein.

In an exemplary embodiment and referring again to FIG. 1, a first hard mask 18 is formed overlying the insulation plate 12, and a first photoresist layer 20 is formed overlying the first hard mask 18. As used herein, the term "overlying" means "over" such that an intervening layer may lie between the first hard mask 18 and the insulation plate 12, and can further mean "on" such that the first hard mask 18 physically contacts the insulation plate 12. The first hard mask 18 may include silicon nitride, which can be formed by chemical vapor deposition using ammonia and dichlorosilane, although it is appreciated that other materials can be used in alternate embodiments. The first hard mask 18 may include one or more layers in various embodiments, and embodiments with more than one layer may have the same or different materials in the different layers. The first photoresist layer 20 (and other photoresist layers described below) may be formed by spin coating a liquid form of the photoresist over the top side 14 of the interposer 10. The liquid photoresist solidifies and may be patterned by exposure to light or other electromagnetic radiation through a mask with transparent sections and opaque sections. The light causes a chemical change in the photoresist such that either the exposed portion or the non-exposed portion of the photoresist can be selectively removed to from the first photoresist layer 20. The desired locations of the first photoresist layer 20 are removed with an organic solvent, and the first hard mask 18 is removed from where the first photoresist layer 20 was removed, such as with a wet etch using hot phosphoric acid for a silicon nitride first hard mask 18. The first photoresist layer 20 (and other photoresist layers described or referenced below) may optionally include a top and/or bottom anti-reflective coating (not illustrated). Many anti-reflective coatings are available, including those formed from inorganic and organic compounds, such as titanium nitride or organosiloxanes. Titanium nitride may be formed by chemical vapor deposition using tetramethylamidotitanium and nitrogen trifluoride, and organosiloxanes may be deposited by spin coating. Anti-reflective coatings may improve the accuracy and critical dimensions during photoresist patterning.

Figure 2:
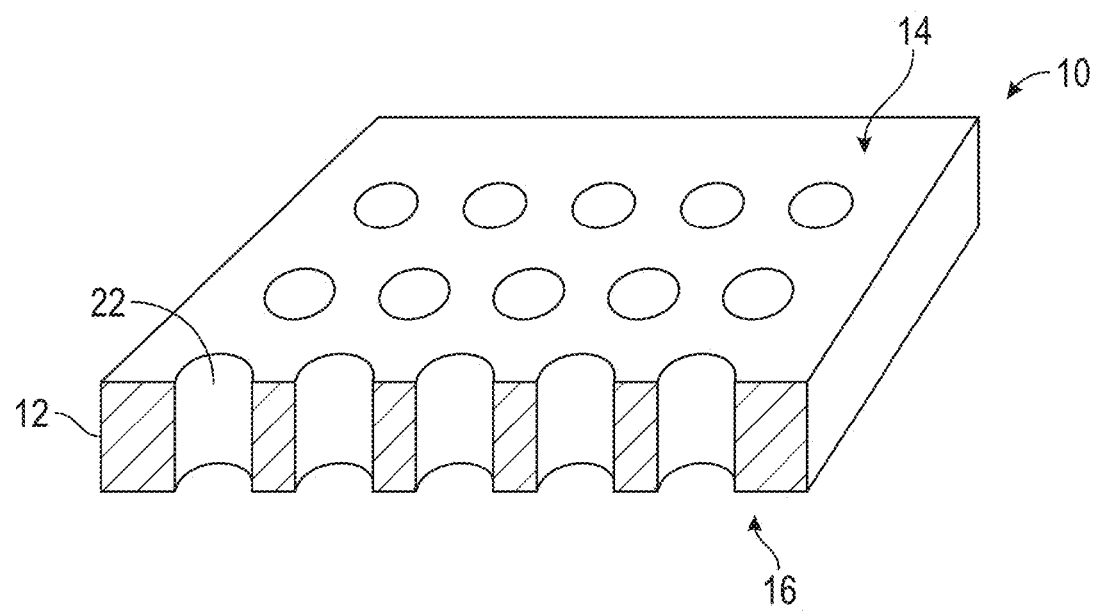
FIG. 2 is a perspective view illustrating a portion of an integrated circuit with an interposer and methods for its fabrication in accordance with an exemplary embodiment.

Referring now to FIG. 2, with continuing reference to FIG. 1, a plurality of voids 22 are formed in the insulation plate 12, where the voids 22 extend from the top side 14 to the bottom side 16 of the insulation plate 12. In an exemplary embodiment with a monocrystalline silicon insulation plate 12 and a silicon nitride first hard mask 18, the voids 22 may be formed with a reactive ion etch using hydrochloric acid, or trifluoromethane, or a variety of other etching compounds that are effective for isotropically etching monocrystalline silicon or other material that is employed for the insulation plate 12. The first photoresist layer 20 may be removed with an oxygen containing plasma prior to forming the voids 22, and the first hard mask 18 may be removed after forming the voids 22 using a hot phosphoric acid wet etch. The voids 22 may be round, square, or a variety of other shapes, and may have a maximum dimension of about 5 to about 20 micrometers (μm) perpendicular to a plane of the insulation plate 12. In alternate embodiments, the voids 22 may be formed by drilling or other mechanical techniques.

Figure 3:
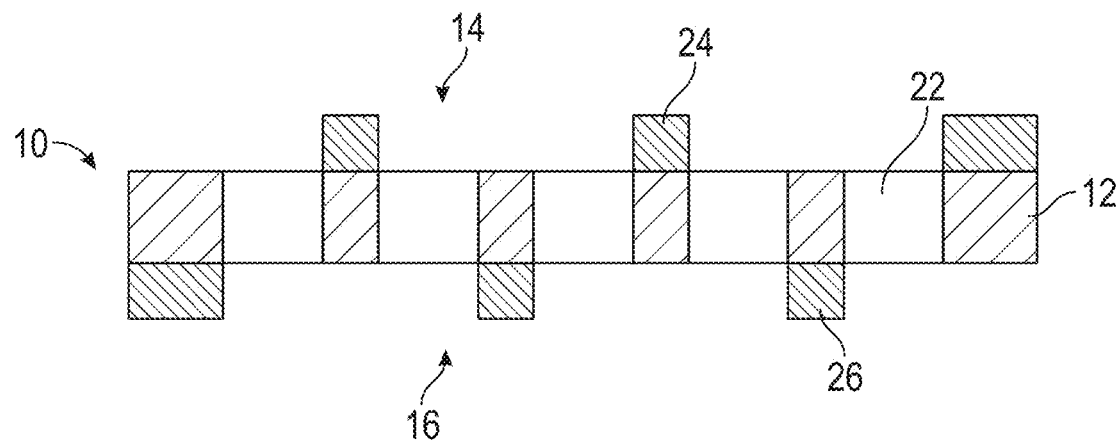

In embodiments and referring to FIG. 3, a second photoresist layer 24 is formed and patterned overlying the top side 14 of the insulation plate 12, and a third photoresist layer 26 is formed and patterned overlying the bottom side 16 of the insulation plate 12. When fabrication is complete, the interposer 10 includes a series of electrical connections, where the electrical connections are designed as desired for a specific integrated circuit product. The patterning of the second and third photoresist layers 24, 26 is part of the formation of these electrical connections, as discussed further below.

Figure 4:
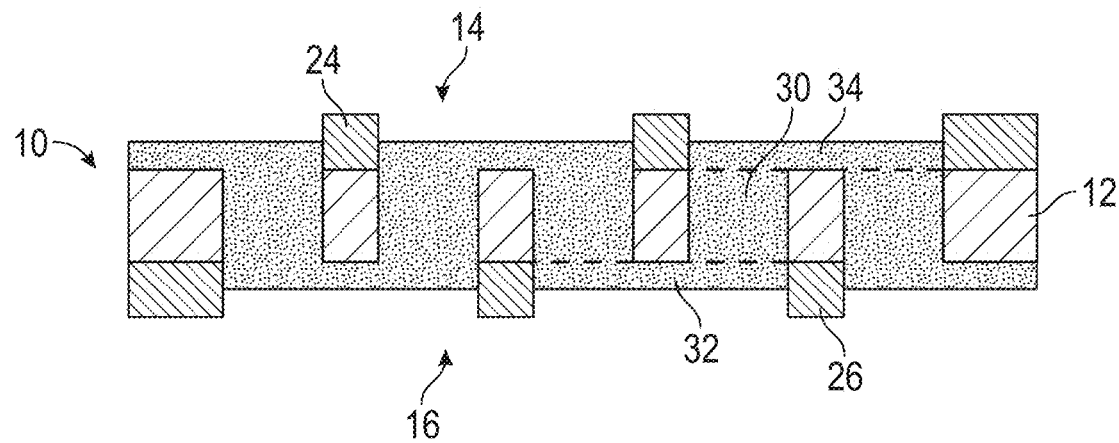
Figure 5:
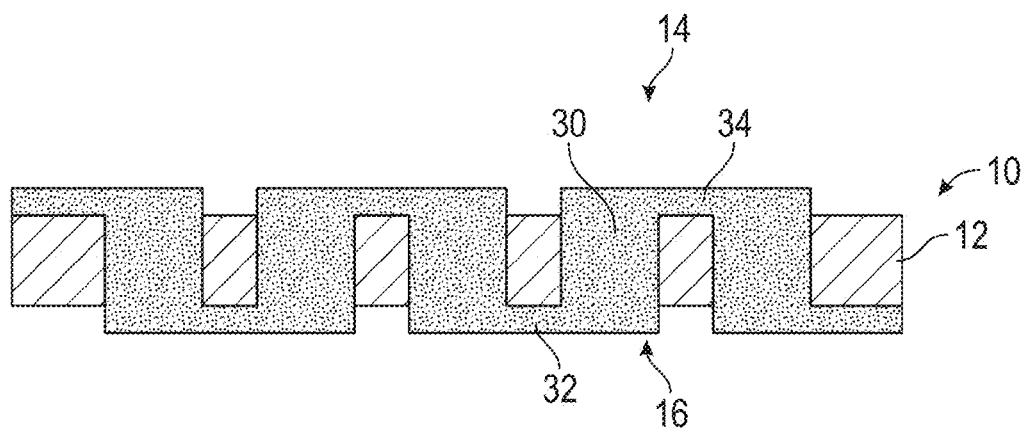

In embodiments and referring to FIG. 4, with continuing reference to FIG. 3, an electrically conductive material is formed in the voids 22 and over the top and bottom sides 14, 16 of the insulation plate 12. An electrically conductive material forms through vias 30, as illustrated in FIG. 4, in the voids 22 illustrated in FIG. 3. The electrically conductive material also forms backside connectors 32 and frontside connectors 34 that electrically connect selected through vias 30. A dashed line demarcates a through via 30, a backside connector 32, and a frontside connector 34 in FIG. 4 for illustration purposes, but no seam exists between these components during actual fabrication. In an exemplary embodiment, the electrically conductive material is copper that may be formed by electroplating, such as with a solution including sulfuric acid and a copper salt. A seed layer (not illustrated) may optionally be formed beforehand. In alternate embodiments, electrically conductive materials other than copper may be used, such as aluminum, titanium, various alloys, or other electrically conductive materials. The second and third photoresist layers 24, 26 are removed after the through vias 30, the backside connectors 32, and the frontside connectors 34 are formed, as illustrated in FIG. 5. The second and third photoresist layer 24, 26 may be removed with an oxygen containing plasma, as mentioned above.

Figure 6:
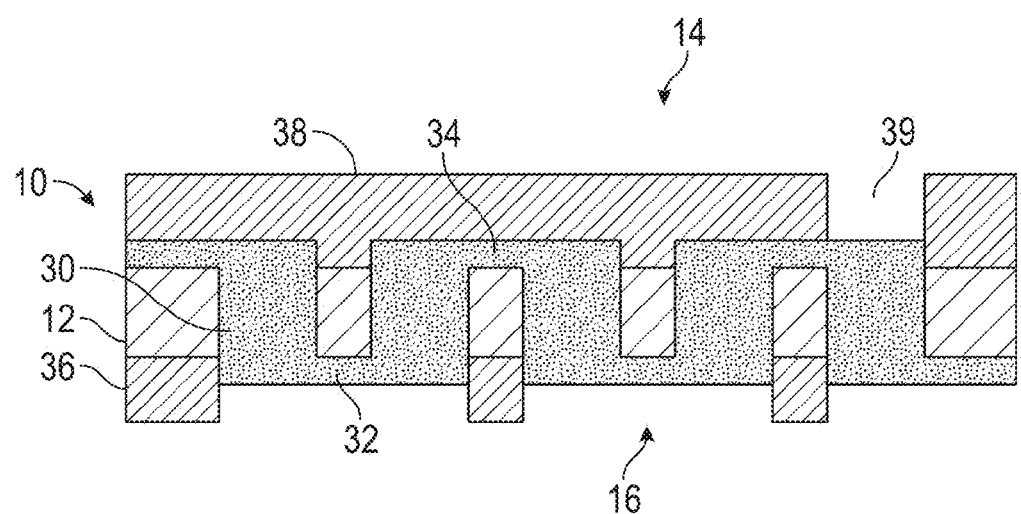

In embodiments and referring to FIG. 6, a lower protection layer 36 is formed in selected areas on the bottom side 16 of the interposer 10. In an exemplary embodiment, the lower protection layer 36 is formed in the same locations as where the third photoresist layer 26 was positioned, and an additional photoresist layer (not illustrated) may be used to selectively expose the interposer 10 where the lower protection layer 36 is formed. The lower protection layer 36 is an electrically insulating material, such as silicon dioxide, which can be formed by chemical vapor deposition using silane and oxygen. However, many other electrically insulating materials may be used in alternate embodiments. An upper protection layer 38 may be formed overlying the top side 14 of the interposer 10 in a similar manner to the lower protection layer 36 in locations where the second photoresist layer 24 was formed. Alternatively, the upper and/or lower protection layers 36, 38 may be formed in areas other than the position of the second and/or third photoresist layers 24, 26, as illustrated for the upper protection layer 38. The lower and upper protection layers 36, 38 serve to electrically isolate through vias 30 in a desired pattern. As can be seen, the through vias 30 are electrically connected by the backside and frontside connectors 32, 34, and the through vias 30 are electrically isolated from each other by the lower and upper protection layers 36, 38 and the insulation plate 12. In the embodiment illustrated in FIG. 6, the through vias 30 are electrically connected in series in a winding pattern. As can be seen, the through vias 30 are formed into an electrical connection system in a desired pattern using the backside and frontside connectors 32, 34 for electrical connections and the lower and upper protection layers 36, 38 for electrical isolation. Interposers 10 generally include many different electrical connections for a desired integrated circuit, so the location of the backside and frontside connectors 32, 34 and the lower and upper protection layers 36, 38 are designed for the plurality of electrical connections. As such, some through vias 30 will be electrically isolated from others, such as when different through vias 30 are incorporated into different electrical connections or different test circuits. The specific layout of the backside and frontside connectors 32, 34 and their connection to the through vias 30 is dictated by the specific application of the interposer 10 and can vary from one interposer 10 to another interposer 10.

Figure 7:
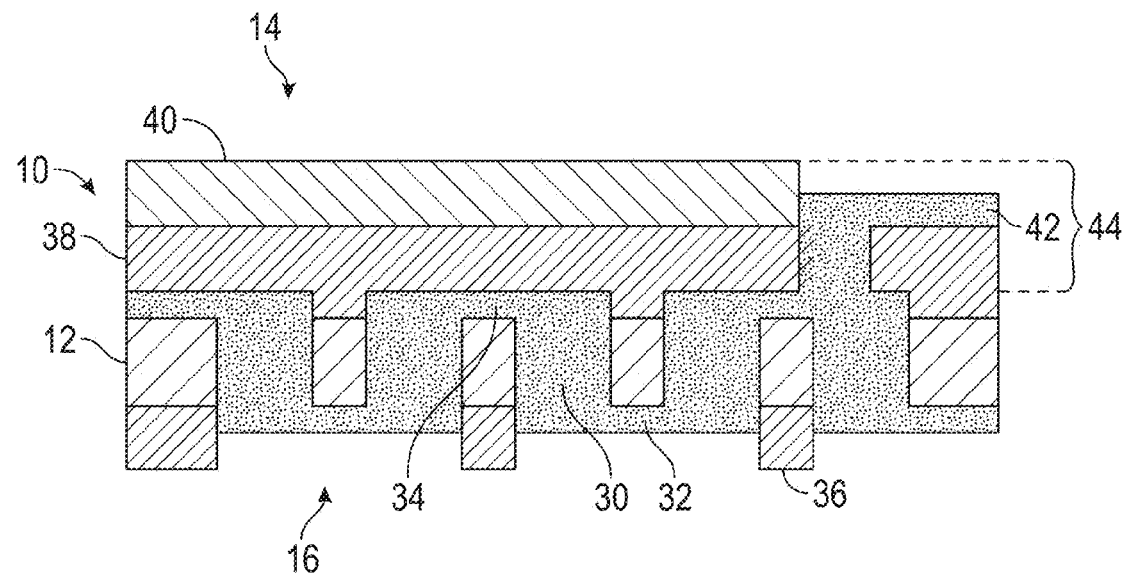

In an exemplary embodiment and as shown in FIG. 7, a fourth photoresist layer 40 is formed and patterned to overlie desired portions of the upper protection layer 38. The numerical reference to the various photoresist layers is not intended to indicate the sequence of the photoresist layers, but is merely used to differentiate the different photoresist layers. As such, there may be more than three photoresist layers formed before the fourth photoresist layer 40. Referring back momentarily to FIG. 6, the upper protection layer 38 is formed with gaps 39 to expose a frontside connector 34 or a through via 30 to which an electrical connection is desired. Referring again to FIG. 7, the fourth photoresist layer 40 is formed and patterned overlying the upper protection layer 38 so that the combined use of the upper protection layer 38 and the fourth photoresist layer 40 provide for the location and layout of an interconnect 42. For example, as illustrated in FIG. 7, the interconnect 42 is formed in electrical connection with one or more of the frontside connectors 34. The fourth photoresist layer 40 may be removed after the interconnect 42 is formed, as described above. The interconnect 42 is used to form electrical connections, such as the electrical connections that will be used in an integrated circuit. As such, the interconnect 42 is a part of a top redistribution layer 44 formed overlying the top side 14 of the insulation plate 12. The interconnect 42 may be formed from the same material as the through vias 30, but in alternate embodiments the interconnect 42 may be other electrically conductive materials. In some embodiments, the top redistribution layer 44 includes additional, successive layers of insulating material and interconnects (not illustrated) formed in a desired pattern to electrically connect the through vias 30 in a desired manner. The successive layers of insulating material and interconnects 42 may be formed by repeating the process described above.

Figure 8:
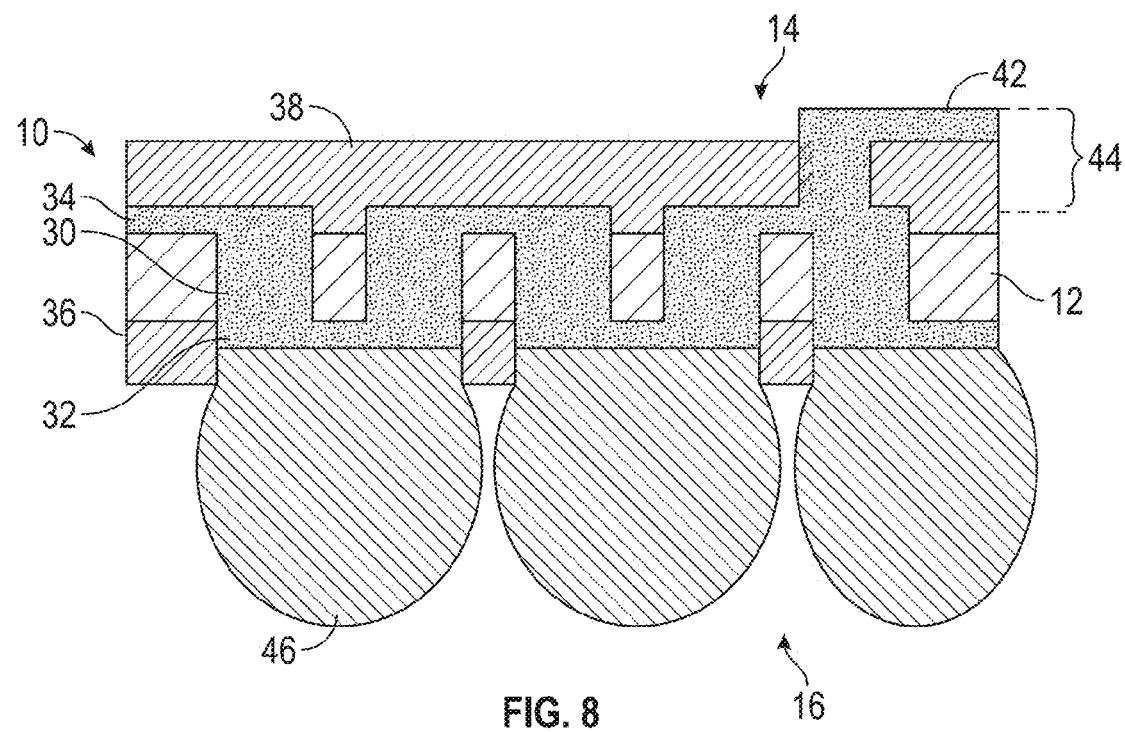

Referring to FIG. 8, an interposer ball 46 may be formed in electrical connection with the backside connector 32. The interposer ball 46 is of an electrically conductive material, and may be used for electrically connecting the interposer 10 to a substrate (not illustrated), an integrated circuit chip (not illustrated), a microelectromechanical system (MEMS, not illustrated), or other components. Different types of interposer balls 46 may be formed in various embodiments. For example, the interposer ball 46 may be a controlled collapse chip connection (referred to as a C4 ball), which has a diameter of about 20 to about 100 µm. In an alternate embodiment, the interposer ball 46 is a part of a ball grid array (referred to as a BGA ball) with a diameter of about 200 to about 500 µm. The interposer ball 46 may include a solder material in some embodiments, where the solder material is a fusible metallic alloy having a melting point lower than that of the backside connector 32 or other portions of the interposer 10. Examples of solder material include tin and lead alloys; tin, silver and copper alloys; and the like. A metallization layer (not illustrated) may optionally be formed over the backside connector 32 to aid in electrically and physically connecting the interposer ball 46 to the backside connector 32. The interposer balls 46 may be electrically connected to the through vias 30 in a wide variety of manners, such as where a single interposer ball 46 is electrically connected to a single through via 30 (not illustrated), or where a single interposer ball 46 is electrically connected to two or more through vias 30 in various embodiments, or in various locations on the interposer 10.

Figure 9:
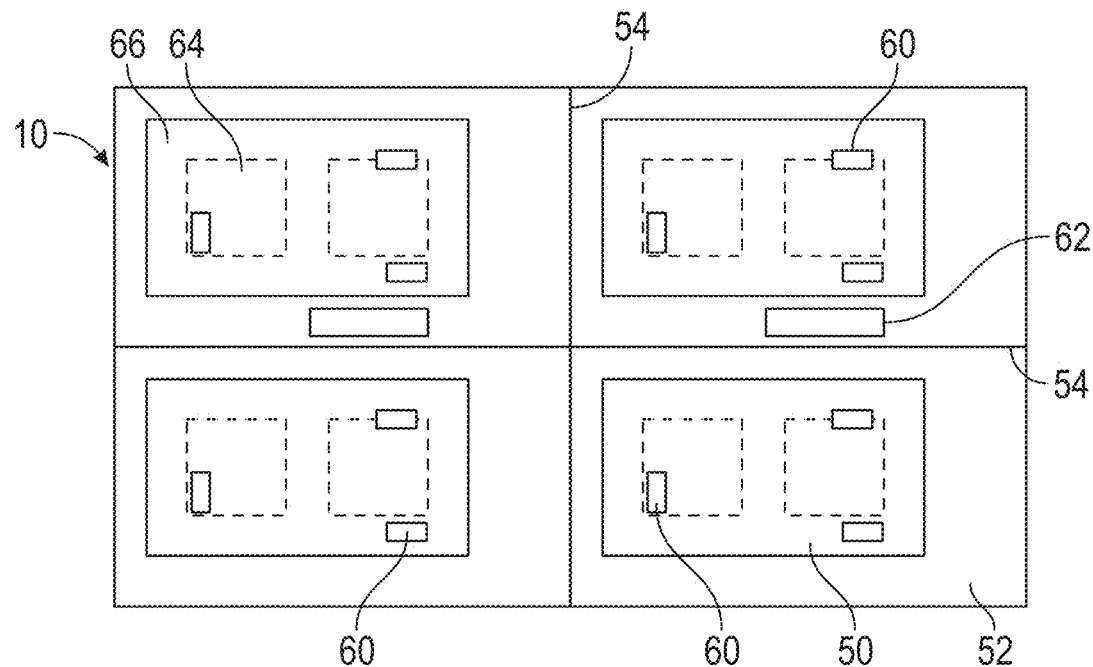
FIG. 9 is a top view of an exemplary embodiment of an interposer.

Reference is made to FIG. 9 with continuing reference to FIG. 8, where FIG. 9 illustrates a top view of an interposer 10 with four prime areas 50 and a frame area 52 in accordance with an exemplary embodiment. The prime areas 50 are portions of the interposer 10 that are to be incorporated into an integrated circuit, so the prime areas 50 include interconnects and/or through vias 30 that electrically connect different components of an integrated circuit. The electrically connected components of the integrated circuit may be one or more of an integrated circuit chip, a MEMS, or other components. The frame area 52 is an area that is not intended to be directly incorporated into an integrated circuit, so the frame area 52 does not electrically connect different components of an integrated circuit. The prime area 50 may include some through vias 30 that are not part of an electrical connection between two or more components of an integrated circuit, but such electrically isolated through vias 30 are within the geography of the prime area 50. As such, the prime area 50 is defined by the geography of the electrically connecting interconnects 42 and/or through vias 30 that make an electrical connection between two or more components in an integrated circuit. In some embodiments, a scribble line 54 is present in the frame area 52, where the interposer 10 is cut or separated at the scribble line 54 to produce a plurality of interposers 10 where each interposer 10 thus formed has an intact prime area 50. In an exemplary embodiment, the entire interposer 10 may be formed from a monocrystalline silicon disc that can then be divided into a plurality of separated interposers 10 having intact prime areas 50.

A plurality of electrical interrogation areas are illustrated in FIG. 9, including a prime area test circuit 60 positioned within the prime area 50 of the interposer, and a frame area test circuit 62 positioned within the frame area 52 of the interposer. Each illustrated prime area 50 of the interposer 10 includes two chip locations 64, where the chip locations 64 are intended locations for mounting an integrated circuit chip to the interposer 10. As such, the chip locations 64 will be the portion of the interposer 10 that directly underlies an integrated circuit chip. As used herein, the term "directly underlying" means a vertical line passing through the upper component also passes through the lower component. The prime areas 50 also include a border area 66 outside of the chip location 64, where the border area 66 includes interconnects 42 that will form electrical connections between two or more components in an integrated circuit, such as forming electrical connections between the two integrated circuit chips. In alternate embodiments, the prime area 50 may include more or fewer chip locations 64 than illustrated. The prime area test circuit 60 is positioned within the prime area 50, and may be positioned within the chip location 64, within the border area 66, or in an overlap position including some of the chip location 64 and some of the border area 66.

Referring again to FIG. 9, with continuing reference to FIG. 8, the prime area 50 of the interposer 10 includes one or more prime area test circuits 60, and the location and size of the prime area test circuits 60 are determined based on an interconnect pattern within the prime area 50. The interposer 10 is designed for a specific integrated circuit, and the interconnect pattern forms the various electrical connections based on that specific integrated circuit. Certain portions of the prime area 50, such as portions with a very low density of interconnects 42, allow for the formation of prime area test circuits 60 that do not interfere with the interconnect pattern for the specific integrated circuit. As such, there are interconnects 42 electrically connected to the prime area test circuit 60 that do not form electrical connections between two or more components in the integrated circuit. The portion of the through vias 30 that form the prime area test circuit 60 and the associated interconnects 42 are part of a separate, test circuit that is not used to electrically connect different components of an integrated circuit. An individual, specific interconnect pattern is analyzed to determine acceptable configurations for prime area test circuits 60 that will not interfere with the operation of the integrated circuit. One or more prime area test circuits 60 are formed in the prime area 50. The interconnect pattern is analyzed to determine the size and number of prime area test circuits 60 that can be included without incorporating interconnects 42 to be employed for electrical connections of the components of the integrated circuits within the prime area test circuit(s) 60. The interposer 10 may also include one or more frame area test circuits 62 that can be utilized for electrical interrogation in the frame area 52.

Figure 10:
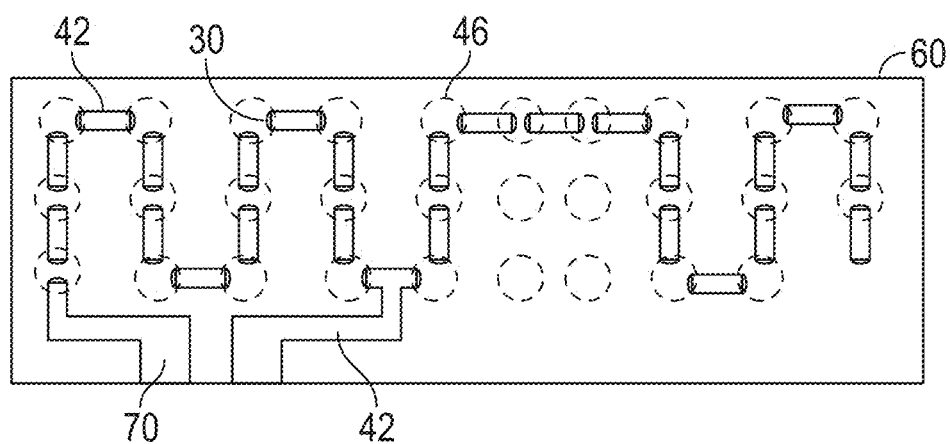
FIG. 10 is a top view illustrating an exemplary embodiment of an prime area test circuit in an interposer.

Reference is made to FIG. 10, which illustrates a top view of an exemplary embodiment of a prime area test circuit 60, with additional reference to FIG. 8, where FIG. 8 illustrates a sectional side view of a portion of a prime area test circuit 60. The illustrated prime area test circuit 60 includes a portion of the plurality of through vias 30 of the interposer 10, where the through vias 30 of the prime area test circuit 60 are electrically connected in series. As illustrated in FIG. 8, one through via 30 of the prime area test circuit 60 is electrically connected to an adjacent through via 30 by one of the backside connectors 32, and that one through via 30 is also electrically connected to a different adjacent through via 30 by one of the frontside connectors 34. The plurality of through vias 30 of the prime area test circuit 60 are electrically connected in series with a zig zag pattern of backside and frontside connectors 32, 34. The prime area test circuit 60 includes the backside and frontside connectors 32, 34 that electrically connect the portion of the plurality of through vias 30 of the prime area test circuit 60. A test pad 70 is electrically connected to the prime area test circuit 60 by one of the interconnects 42. It will be appreciated that FIG. 10 illustrates an exemplary embodiment of an prime area test circuit 60 contemplated herein and is not meant to limit other various embodiments to the depicted illustration.

Figure 11:
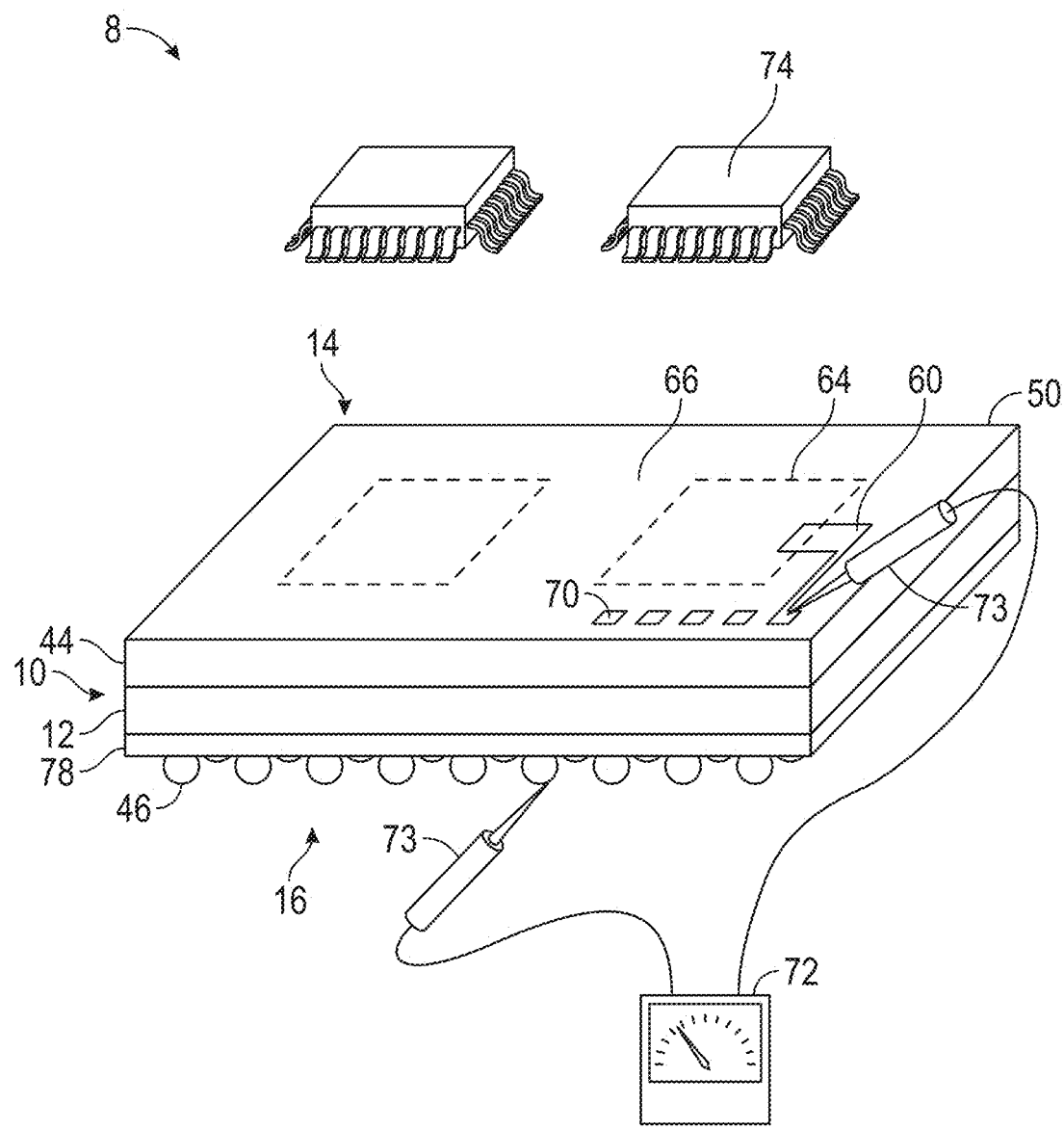
FIG. 11 is an exploded perspective view of an embodiment of an integrated circuit including an interposer.
Figure 12:
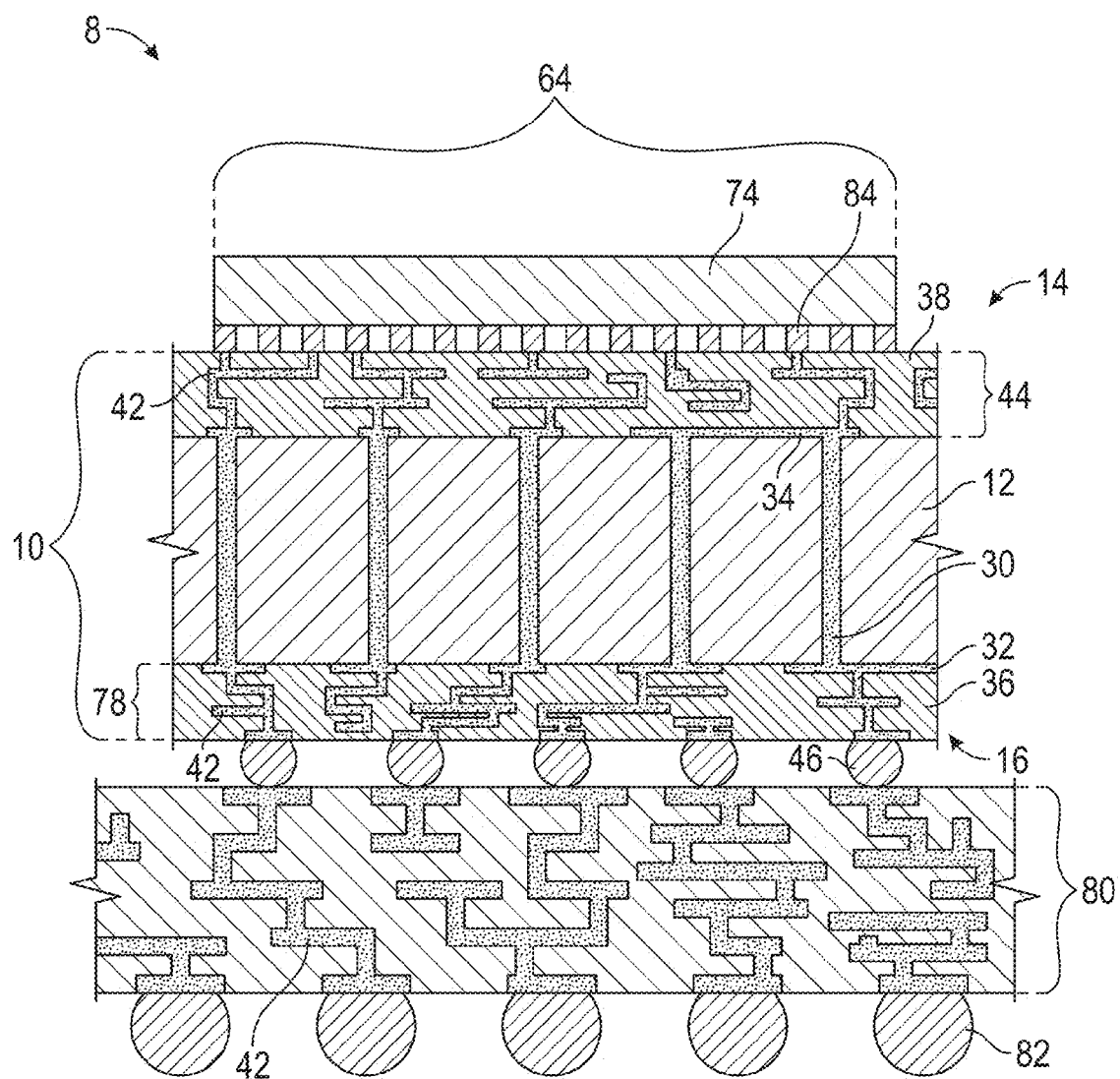
FIG. 12 is a cross-sectional view of another embodiment of a portion of an interposer electrically connected to a substrate.

Referring to FIG. 11, with continuing reference to FIGS. 8-10, the through vias 30 of the prime area test circuit 60 can be electrically interrogated by electrically contacting electrical probes 73 of a test device 72 to two different through vias 30, such as by using the test pad 70 and/or a interposer ball 46 that are electrically connected to different through vias 30 of the prime area test circuit 60. A bottom redistribution layer 78 may optionally be formed underlying the bottom side 16 of the insulation plate 12 in a similar manner to that used to form the top redistribution layer 44 overlying the top side 14 of the insulation plate 12. Referring to an exemplary embodiment in FIG. 12, with continued reference to FIGS. 8-11, the bottom redistribution layer 78 may be electrically connected to the prime area test circuit 60 and/or the frame area test circuit 62, and may facilitate electrical interrogation of the prime and/or frame area test circuits 60, 62. The bottom redistribution layer 78 may also form electrical connections between the through vias 30 of the interposer 10 with a substrate 80 that may underlie the bottom side 16. In FIG. 12, the prime area test circuit 60 is represented by the two right through vias 30, which are electrically connected in the top redistribution layer 44. The bottom redistribution layer 78 electrically connects the interposer balls 46 with the prime area test circuit 60, and with other through vias 30 of the interposer 10. A substrate 80 is in electrical communication with the interposer 10 through the interposer balls 46. The substrate 80 includes a plurality of interconnects 42, an insulating material such as that described above for the insulation plate 12, and a plurality of substrate balls 82. The substrate balls 82 may be C4 balls, BGA balls, or other devices useful for forming electrical connections, as described above for the interposer balls 46. As can be seen, electrical interrogation of the prime and/or frame area test circuits 60, 62 may be performed in some embodiments after the interposer 10 is electrically connected to the substrate 80 by contacting a substrate ball 82 as well as another contact point with the electrical probes 73. The integrated circuit chip 74 may include a plurality of pins 84 for electrical connection to the interposer 10 or to other components.

The entire prime area test circuit 60 can be electrically interrogated by electrically contacting the electrical probes 73 of the test device 72 to through vias 30 on opposite sides of the prime area test circuit 60, but smaller portions of the prime area test circuit 60 can be electrically interrogated by electrically contacting the electrical probe 73 of the test device 72 to other through vias 30 of the prime area test circuit 60. For example, an prime area test circuit 60 may include several interposer balls 46 along the length of the prime area test circuit 60, so a portion of the prime area test circuit 60 may be electrically interrogated by contacting the electrical probe 73 of the test device 72 to a interposer ball 46 that is not at either end of the prime area test circuit 60. The test pad 70 includes an electrically conductive material that is exposed on the top side 14 of the interposer 10, such as exposed on the surface of the top redistribution layer 44. The test pad 70 may be formed using the process described above for the interconnect 42, where the test pad 70 is not covered during the formation of the top redistribution layer 44. Referring to FIG. 8, the test pad 70 may be formed as an interconnect 42 which has a surface area that is large enough to be contacted with the electrical probe 73. The test pad 70 may be covered with photoresist during the formation of subsequent layers, so no dielectric material is formed overlying the test pad 70. As such, the test pad 70 remains exposed and accessible for contact with the electrical probe 73.

The test device 72 may electrically interrogate the prime area test circuit 60 for many different properties, such as electrical resistance, conductivity, shorts, capacitance, etc. The prime area test circuit(s) 60 may be electrically interrogated before an integrated circuit chip 74 is attached to the interposer 10 and the top redistribution layer 44. As such, the interposer 10 can be electrically interrogated for quality assurance or for other purposes during the manufacturing process, and such electrical interrogations can be incorporated into the overall manufacturing process. Furthermore, the prime area 50 of the interposer 10 can be electrically interrogated directly, and this electrical interrogation of the prime area 50 may optionally be supplemented with electrical interrogation of the frame area 52 of the interposer 10 using the frame area test circuit 62.

In embodiments and referring again to FIG. 11, one or more integrated circuit chip(s) 74 are electrically connected to the interposer 10, and the integrated circuit chip(s) 74 may be connected to the interposer 10 after the prime area test circuit 60 is electrically interrogated. In some embodiments, the prime area test circuit 60 may be electrically interrogated after the integrated circuit chip(s) 74 is connected to the interposer 10, or the prime area test circuit 60 may be electrically interrogated after one or more integrated circuit chip(s) 74 are connected but before other integrated circuit chips 74 are connected. In yet another embodiment, the prime area test circuit 60 may be electrically interrogated after all the integrated circuit chip(s) 74 are connected to the interposer 10, but before an integrated circuit 8 is completely manufactured. The integrated circuit chip 74 is connected to the chip location 64 of the prime area 50. The integrated circuit chip 74 may be a wide variety of electronic chips that include multiple electronic components, such as transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; or other suitable elements.

Figure 13:
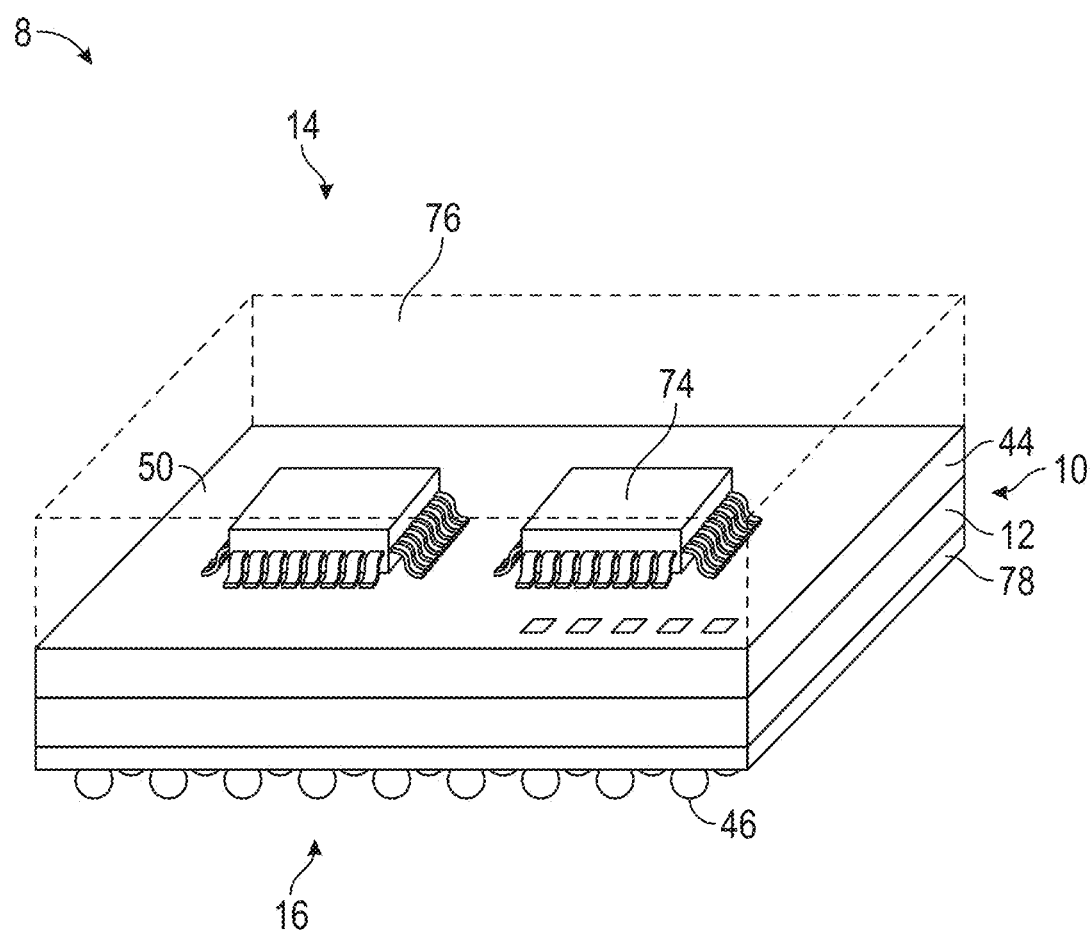
FIG. 13 is a perspective view of an embodiment of an integrated circuit including an interposer, where an overmold is shown as transparent for illustration purposes.

In embodiments and referring to FIG. 13, an overmold 76 may be formed overlying the top side 14 of the prime area 50 of the interposer 10, including the integrated circuit chip(s) 74, the test pad 70, and the top redistribution layer 44. In FIG. 12 the overmold is shown as transparent using dotted lines for illustration purposes. In an exemplary embodiment, the overmold 76 overlies the entire top side 14 of the prime area 50 of the interposer 10. Another overmold (not illustrated) may optionally be formed overlying the bottom side 16 of the interposer 10, but the bottom side 16 of the interposer 10 may be connected to a substrate (not illustrated) or other components in alternate embodiments. The overmold 76 may be an electrically insulating material, such as an epoxy polymer that can be formed by combining the reactive components and painting or coating the combined components onto the interposer 10 before the epoxy cures. The epoxy may then cure on the interposer 10 to form the overmold 76. Many other types of overmold 76 may be used in alternate embodiments, such as polyimide polymers, silicon dioxide, or other electrically insulating materials. The overmold 76 is formed after the prime area test circuit 60 is electrically interrogated in many embodiments, in part because the test pads 70 may be covered by the overmold 76. The overmold 76 protects the interposer 10 and the integrated circuit chip 74.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   producing an interposer comprising an insulation plate and a plurality of through vias passing through the insulation plate, wherein the interposer comprises a prime area and a frame area; and
   forming a prime area test circuit in a chip location of the prime area, wherein the prime area test circuit comprises a portion of the plurality of through vias that are electrically connected in series, wherein the portion of the plurality of through vias of the prime area test circuit are electrically isolated from an integrated circuit chip, and wherein; and
   electrically connecting the integrated circuit chip to the chip location of the interposer, wherein the chip location directly underlies the integrated circuit chip, wherein the prime area is defined by the geography of the interposer that includes through vias that electrically connect the integrated circuit chip to another component of the integrated circuit, and the frame area is defined by the geography of the interposer outside of the prime area that includes through vias that are electrically isolated from the integrated circuit chip, and wherein the frame area does not include through vias that are electrically connected to the integrated circuit chip.

2. The method of claim 1 further comprising:
   forming a top redistribution layer on a top side of the interposer, wherein the top redistribution layer electrically connects the prime area test circuit to a test pad on the top side.

3. The method of claim 2 further comprising:
   electrically interrogating the prime area test circuit; and covering the test pad with an overmold after electrically interrogating the prime area test circuit, wherein the overmold comprises an electrically insulating material.

4. The method of claim 1 wherein:
forming the prime area test circuit comprises forming the prime area test circuit such that at least a portion of the prime area test circuit is in a position other than the chip location.

5. The method of claim 4 wherein:
forming the prime area test circuit comprises forming the prime area test circuit in a border area of the prime area, wherein the border area is different than the chip location that directly underlies the integrated circuit chip.

6. The method of claim 1 further comprising:
forming a bottom redistribution layer underlying a bottom side of the insulation plate; and
forming an interposer ball underlying the bottom redistribution layer, wherein the bottom redistribution layer electrically connects the prime area test circuit to the interposer ball.

7. The method of claim 1 wherein forming the prime area test circuit further comprises forming a plurality of prime area test circuits in the prime area.

8. A method of producing an integrated circuit comprising:
forming a prime area test circuit in an interposer, wherein the interposer comprises an insulation plate and a plurality of through vias passing through the insulation plate, and wherein the prime area test circuit comprises a portion of the plurality of through vias that are within the prime area, and wherein at least a portion of the prime area test circuit is in a chip location;
electrically interrogating the prime area test circuit;
connecting an integrated circuit chip to the interposer after electrically interrogating the prime area test circuit, wherein the integrated circuit chip is positioned within the prime area, wherein the chip location directly underlies the integrated circuit chip, and wherein the prime area is defined by the geography of the interposer that includes through vias that electrically connect the integrated circuit chip to another component of the integrated circuit; and
wherein forming the prime area test circuit comprises forming the prime area test circuit such that the portion of the plurality of through vias of the prime area test circuit is electrically isolated from the integrated circuit chip.

9. The method of claim 8 wherein:
forming the prime area test circuit comprises forming at least a portion of the prime area test circuit in an area other than the chip location.

10. The method of claim 9 wherein forming the prime area test circuit comprises:
forming at least a portion of the prime area test circuit in a border area of the prime area, wherein the border area is different than the chip location.

11. The method of claim 8 further comprising:
forming the prime area test circuit further comprises forming a test pad in electrical communication with the portion of the plurality of the through vias of the prime area test circuit.

12. The method of claim 11 wherein:
electrically interrogating the prime area test circuit comprises electrically contacting the test pad with an electrical probe of a test device.

13. The method of claim 11 further comprising covering the integrated circuit chip and the test pad with an overmold.

14. The method of claim 8 wherein forming the prime area test circuit comprises:
electrically connecting the portion of the plurality of through vias of the prime area test circuit in series.

15. The method of claim 8 further comprising: forming a frame area test circuit in a frame area, wherein the frame area is defined by the geography of the interposer outside of the prime area that includes through vias that are electrically isolated from the integrated circuit chip, and wherein the frame area does not include through vias that are electrically connected to the integrated circuit chip.

16. The method of claim 8 wherein electrically interrogating the prime area test circuit comprises electrically interrogating a plurality of prime area test circuits.

* * * * *